United States Patent Office 3,667,959
Patented June 6, 1972

3,667,959

PHOTOSENSITIVE AND THERMOSENSITIVE ELEMENT, COMPOSITIONS AND PROCESS

Stanley M. Bojara and Richard A. de Mauriac, Rochester, N.Y., assignors to Eastman Kodak Company, Rochester, N.Y.

No Drawing. Filed May 1, 1970, Ser. No. 33,966
Int. Cl. G03c *1/02*
U.S. Cl. 96—114.1 27 Claims

ABSTRACT OF THE DISCLOSURE

A non-aqueous, polar, organic solvent, such as a compound containing a $$-\overset{O}{\overset{\|}{C}}-,\quad -\overset{O}{\overset{\|}{S}}-$$

or —$SO_2$— moiety, in a photosensitive and thermosensitive element suitable for dry processing with heat, provides improved maximum image densities and reduced exposure and processing time in some cases. A combination of a non-aqueous, polar, organic compound, such as one containing a $$-\overset{O}{\overset{\|}{C}}-,\quad -\overset{O}{\overset{\|}{S}}-$$

or —$SO_2$— moiety, in conjunction with a stable source of silver for physical development are useful in photosensitive elements for dry processing. The element can contain a sensitizing dye and a photosensitive silver halide, or other suitable photosensitive metal salts.

BACKGROUND OF THE INVENTION

Field of the invention

This invention relates to photosensitive elements, compositions and processes for developing and enhancing the maximum image density using so-called dry processing with heat.

In one of its aspects, it relates to photosensitive elements suitable for dry processing with heat containing a non-aqueous, polar, organic compound, especially one containing at least one $$-\overset{O}{\overset{\|}{C}}-,\quad -\overset{O}{\overset{\|}{S}}-$$

or —$SO_2$— moiety. In another of its aspects, it relates to a photographic composition suitable for dry processing with heat containing a non-aqueous, organic, polar solvent. A further aspect relates to a dry process of developing and enhancing the maximum density of an image in a photosensitive element containing a non-aqueous, polar, organic compound as described.

Description of the prior art

It is known to develop a latent image in a photosensitive non-silver halide element using an organic silver salt, as a source of silver for physical development in so-called dry processing with heat, the photosensitive element can contain a silver salt as a source of silver for physical development as well as a non-aqueous solvent. Such a process is described, for example, in U.S. Pat. No. 3,429,706 of Shepard et al. issued Feb. 25, 1969 and in U.S. Pat. No. 3,442,682 of Fukawa et al. issued May 6, 1969.

Other methods of so-called dry processing with heat are described, for example, in U.S. Pat. No. 3,152,904 of Sorensen et al. issued Oct. 13, 1964. For example, (1) an organic silver salt which is an oxidizing agent, (2) an organic reducing agent and a low concentration of photosensitive silver halide are provided in a light-sensitive element. After imagewise exposure, the resulting latent image is developed by heating the element. Methods of this type are described, for example, in U.S. Pat. No. 3,457,075, French Patent 1,441,619 and Belgian Patent 705,872.

Non-aqueous compounds, such as acid amides and carbamates, have been proposed in certain photosensitive and thermosensitive materials. These compounds can serve as so-called "carriers" for developers in copy sheets employing the diffusion transfer process, such as described in U.S. Pat. No. 3,347,675 of Henn et al. issued Oct. 17, 1967. In addition, certain non-aqueous compounds have been used in photosensitive elements which upon heating serve as solvents for developing agents as described in British Patent 1,131,108. In some cases these photosensitive and thermosensitive elements have not been entirely satisfactory. Accordingly, there has been a continuing need for a photosensitive element suitable for so-called dry processing with heat which has improved maximum image densities, including reduced heat processing temperature, exposure and processing time.

SUMMARY OF THE INVENTION

According to the invention, improved image densities, including reduced heat processing temperature, exposure and processing time is provided in a photosensitive and thermosensitive element, composition and/or process employing such an element, comprising a support, an oxidation-reduction image forming combination comprising (a) an oxidizing agent and (b) a reducing agent, a binder and a non-aqueous, polar, organic solvent from the image forming combination. The described solvent has at least one $$-\overset{O}{\overset{\|}{C}}-,\quad -\overset{O}{\overset{\|}{S}}-$$

or —$SO_2$— group and is solid at about 20° C. in the described element.

DESCRIPTION OF PREFERRED EMBODIMENTS

A range of compounds can be utilized which are non-aqueous, polar, organic compounds. These are compounds which contain a $$-\overset{O}{\overset{\|}{C}}-,\quad -\overset{O}{\overset{\|}{S}}-$$

or —$SO_2$— moiety and which upon heating provide increased maximum densities compared to an element not containing the non-aqueous, polar, organic compound, and do not adversely affect the latent image before so-called dry processing with heat. It is believed, that during so-called dry processing with heat, silver salts ionize rapidly in elements containing these solvents of high dielectric constant, e.g. D=30–170. These dielectric constants are a means of measuring the relative ability of a solvent to enhance the separation of positive and negative ions in a solution (Gould Mechanism and Structure in Organic Chemistry, Henry Holt and Company, Inc., New York, 1959, pp. 102–103). Thus the possibility of finding a lone ion in ether which has a dielectric constant of 4.5/25° C. is much less than in a solvent such as tetrahydrothiophene-1,1-dioxide which has a dielectric constant of 44/30° C. It is believed that these non-aqueous, polar, organic solvents of high dielectric constant enable the silver ions to take part more readily in the dry physical development step. In addition, these non-aqueous solvents, it is believed, partly because of their nucleophilic character, readily solvate unexposed silver cations thereby accelerating the rate of physical development onto the latent image specks. A simple test for determining the utility of a non-aqueous, polar, organic solvent in a photosensitive and thermosensitive element according to the invention is illustrated in Example 1. If a similar response is obtained, the non-aqueous, polar, organic solvent is deemed adequate.

The non-aqueous polar solvent containing a $$-\overset{\overset{O}{\|}}{S}-$$

moiety which is preferred is of the formula:

$$R-\overset{\overset{O}{\|}}{S}-R$$

wherein R is alkyl, such as alkyl containing 1 to 5 carbon atoms, such as methyl, ethyl, propyl, butyl or pentyl or aryl, such as aryl containing 6 to 12 carbon atoms, such as phenyl, tolyl, or xylyl. Alkyl or aryl, as described can contain a range of substituents which do not adversely affect the maximum density or stabilization desired upon heating, such as alkoxy, e.g. alkoxy containing 1 to 5 carbon atoms, such as methoxy, ethoxy, propoxy, butoxy, and pentoxy; halogen, amino, carboxy, carboxylate and carbamyl. R can be symmetrical or unsymmetrical.

An especially suitable non-aqueous, polar, organic solvent containing a $$-\overset{\overset{O}{\|}}{S}-$$

moiety is methylsulfinylmethane of the formula:

$$CH_3-\overset{\overset{O}{\|}}{S}-CH_3$$

Examples of suitable solvents which can be employed in the practice of the invention and contain a $$-\overset{\overset{O}{\|}}{S}-$$

moiety include:

ethylsulfinylethane,
ethylsulfinylmethane,
phenylsulfinylethane,
benzylsulfinylethane, and/or
bis-phenylsulfoxide.

The non-aqueous, polar, organic solvent containing a $-SO_2-$ moiety which is preferred is of the formula:

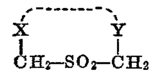

wherein X and Y are each hydrogen, alkyl, especially alkyl containing 1 to 20 carbon atoms, such as methyl, ethyl, propyl, butyl, octyl, decyl and eicosyl, aryl, especially aryl containing 6 to 12 carbon atoms, such as phenyl, tolyl and xylyl; and X and Y can be members completing a heterocyclic ring, especially a 5-member heterocyclic ring containing sulfur, e.g. tetrahydrothiophene-1,1-dioxide. Alkyl or aryl, as described can contain a range of substituents which do not adversely affect the maximum density or stabilization desired upon heating, such as alkoxy, e.g. alkoxy containing 1 to 5 carbon atoms, such as methoxy, ethoxy, propoxy, butoxy, and pentoxy; halogen, amino, carboxy, carboxylate, carbamyl, carbamylphenyl and carbamylalkyl.

An especially suitable non-aqueous, polar solvent containing a $-SO_2-$ moiety is tetrahydrothiophene-1,1-dioxide of the formula:

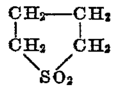

Examples of suitable solvents which can be employed in the practice of the invention and contain a $-SO_2-$ moiety include:

3-methyl-2,4,5-trihydrothiophene-1,1-dioxide,
2,5-dihydrothiophene-1,1-dioxide,
2,3-dihydro-3-methylthiophene-1,1-dioxide, and/or
4-hydroxy-2-methyldiphenylsulfone.

The non-aqueous polar solvent containing a $$-\overset{\overset{O}{\|}}{C}-$$

moiety which is preferred is of the formula:

wherein X and Y are each hydrogen, oxygen, alkyl, especially alkyl containing 1 to 20 carbon atoms, such as methyl, ethyl, propyl, butyl, octyl, decyl and eicosyl, amino, aryl, especially aryl containing 6 to 12 carbon atoms, such as phenyl, tolyl and xylyl; and X and Y can be members of a carbocyclic ring, especially a 4 to 6 member carbocyclic ring containing oxygen. Alkyl or aryl, as described can contain a range of substituents which do not adversely affect the maximum density or stabilization desired upon heating, such as alkoxy, e.g. alkoxy containing 1 to 5 carbon atoms, such as methoxy, ethoxy, propoxy, butoxy, and pentoxy; halogen, amino, carboxy carboxylate, carbamyl, carbamylphenyl and carbamylalkyl.

An especially suitable non-aqueous, polar solvent containing a $$-\overset{\overset{O}{\|}}{C}-$$

moiety is 4-hydroxybutanoic acid lactone of the formula:

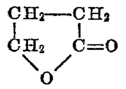

Examples of suitable compounds which can be employed in the practice of the invention and contain a $$-\overset{\overset{O}{\|}}{C}-$$

moiety include 3-hydroxypropanoic acid lactone,
4-hydroxybutanoic acid lactone,
4-hydroxypentanoic acid lactone,
5-hydroxypentanoic acid lactone, and/or
4-hydroxyhexanoic acid lactone.

The described non-aqueous, polar compounds are especially suitable according to the invention in an element which is photosensitive and thermosensitive, especially a photosensitive element which is suitable for processing wtih heat. Photosensitive and thermosensitive elements which are suitable for dry processing with heat can provide a developed image by physical development, such as described in U.S. Pat. 3,457,075 of Morgan et al. issued July 22, 1969. Other elements of this type are described, for example, in U.S. Pat. 3,429,706 of Shepard et al. issued Feb. 25, 1969 and U.S. Pat. 3,152,904 of Sorensen et al. issued Oct. 13, 1964. In elements as described, typically a support is provided with an organic silver salt oxidizing agent, an organic reducing agent, and photosensitive silver salt, especially silver halide. A visible image on the photosensitive and thermosensitive element can be produced within a few seconds after exposure by heating to moderately elevated temperatures.

Accordingly, one embodiment of the invention is: in a photosensitive and thermosensitive element comprising a support, an oxidation-reduction image forming combination comprising (a) an oxidizing agent and (b) a reducing agent, an activator toning agent and a binder; the improvement comprising a non-aqueous, polar, organic solvent for said image forming combination, said solvent having at least one $$-\overset{\overset{O}{\|}}{C}-,\ -\overset{\overset{O}{\|}}{S}-$$

or —$SO_2$— group, and being solid at about 20° C. in said element. For example, the photosensitive and thermosensitive element as described can comprise a support and (1) silver behenate,
(2) a phenolic reducing agent,
(3) photosensitive silver halide,
(4) a phthalazinone activator-toner,
(5) polyvinylbutyral binder
(6) tetrahydrothiophene-1,1-dioxide, and
(7) a sensitizing dye.

The described elements can comprise a silver salt of an organic acid, as an oxidizing agent. The silver salt of the organic acid should be resistant to darkening under illumination to prevent undesired deterioration of a developed image. An especially suitable class of silver salts of organic acids is represented by the water insoluble silver salts of long-chain fatty acids which are stable to light. Compounds which are suitable silver salts include silver behenate, silver stearate, silver oleate, silver laurate, silver hydroxystearate, silver caprate, silver myristate, and silver palmitate. Other suitable oxidizing agents are silver benzoate, silver phthalazinone, silver benzotriazole, silver saccharin, silver 4′-n-octadecyloxydiphenyl-4-carboxylic acid, silver orthoaminobenzoate, silver acetamidobenzoate, silver furoate, silver camphorate, silver p-phenylbenzoate, silver phenyl acetate, silver salicylate, silver butyrate, silver terephthalate, silver phthalate, silver acetate, and silver acid phthalate. Oxidizing agents which are not silver salts can be employed if desired, such as zinc oxide, gold stearate, mercuric behenate, auric behenate and the like, but silver salts are preferred.

An organic reducing agent is employed in the practice of the invention to provide a desired developed image. Such reducing agents are typically silver halide developing agents. Suitable silver halide developing agents or organic reducing agents include, for example, polyhydroxybenzenes such as hydroquinone developing agents, e.g. hydroquinone, alkyl substituted hydroquinones as exemplified by tertiary butyl hydroquinone, methyl hydroquinone, 2,5-dimethyl hydroquinone and 2,6-dimethyl hydroquinone; catechols and pyrogallol; halo-substituted hydroquinones such as chlorohydroquinone or dichlorohydroquinone; alkoxy-substituted hydroquinones such as methoxy hydroquinone or ethoxy hydroquinone; methylhydroxy naphthalene; phenylenediamine developing agents; methylgalate; aminophenol developing agents, such as 2,4-diaminophenols and methylaminophenols; bis-phenolic reducing agents, such as 2,2′-methylene-bis-(6-t-butyl-4-methylphenol); ascorbic acid developing agents such as ascorbic acid, ascorbic acid ketals and ascorbic acid derivatives such as those described in U.S. Pat. 3,337,342 of Green issued Aug. 22, 1967; hydroxylamine developing agents such as N,N-di(2-ethoxyethyl) hydroxylamine; 3-pyrazolidone developing agents such as 1-phenyl-3-pyrazolidone and 4-methyl-4-hydroxymethyl-1-phenyl-3-pyrazolidone including those described in British Pat. 930,572 published July 3, 1963; hydroxytetronic acid, and hydroxytetronimide developing agents; reductone developing agents such as anhydro dihydro piperidino hexose reductone or anhydro dihydro pyrrolidino hexose reductone; and the like.

The described element contains a photosensitive salt, especially a photosensitive silver salt. Suitable photosensitive silver salts include silver chloride, silver bromide, silver bromoiodide, silver chlorobromoiodide or mixtures thereof. The photosensitive silver halide can be coarse or fine-grain, very fine grain emulsions being especially useful. The emulsion containing the photosensitive silver halide can be prepared by any of the well-known procedures in the photographic art, such as single-jet emulsions, double-jet emulsions, such as Lippmann emulsions, ammoniacal emulsions, thiocyanate and thioether ripened emulsions, such as those described in U.S. Pat. 2,222,264 of Nietz et al. issued Nov. 14, 1940; U.S. Pat. 3,320,069 of Illingsworth issued May 15, 1967 and U.S. Pat. 3,271,157 of McBride issued Sept. 6, 1966. Surface image silver halide emulsions can be used. If desired, mixtures of surface and internal image silver halide emulsions can be used as described in U.S. Pat. 2,996,382 of Luckey et al. issued Apr. 15, 1961. Negative type emulsions can be used. The silver halide emulsion can be a regular grain emulsion such as described in Klein and Moisar, Journal of Photographic Science, volume 12, No. 5, September-October (1964) pages 242–251.

The silver halide emulsions employed in the practice of the invention can be unwashed or washed to remove soluble salts. In the latter case the soluble salts can be removed by chill setting and leaching or the emulsion can be coagulation washed.

The silver halide employed in the practice of the invention can be sensitized with chemical sensitizers, such as with reducing agents; sulfur, selenium, or tellurium compounds; gold, platinum, or palladium compounds; or combinations of these. Suitable procedures are described, for example, in U.S. Pat. 1,623,499 of Shepard issued Apr. 5, 1927; U.S. Pat. 2,399,083 of Waller et al. issued Apr. 23, 1946; U.S. Pat. 3,297,447 of McVeigh issued Jan. 10, 1967; and U.S. Pat. 3,297,446 of Dunn issued Jan. 10, 1967.

Photographic silver halide emulsions employed in the practice of the invention can be protected against the production of fog and can be stabilized against loss of sensitivity during keeping. Suitable antifoggants and stabilizers, e.g. used alone or in combination include, for example, thiazolium salts; azaindenes; mercury salts as described, for example, in U.S. Pat. 2,728,663 of Allen et al. issued Dec. 27, 1955; urazoles; sulfocatechols; oximes described, for example, in British Pat. 623,448; nitron; nitroindazoles; polyvalent metal salts described, for example, in U.S. Pat. 2,839,405 of Jones issued June 17, 1958; platinum, palladium and gold salts described, for example, in U.S. Pat. 2,566,263 of Trivelli et al. issued Aug. 28, 1951 and U.S. Pat. 2,597,915 of Yutzy et al. issued May 27, 1952.

A photosensitive and thermosensitive element and emulsions described and used in the practice of the invention can contain various colloids alone or in combination as vehicles, binding agents and in various layers. Suitable materials are typically hydrophobic but hydrophilic materials can also be employed. They are transparent or translucent and include both naturally-occurring substances such as proteins, for example, gelatin, gelatin derivatives, cellulose derivatives, polysaccharides such as dextran, gum arabic and the like; and synthetic polymeric substances such as water-soluble polyvinyl compounds like poly(vinyl pyrrolidone), acrylamide polymers and the like. Other synthetic polymeric compounds which can be employed include dispersed vinyl compounds such as in latex form and particularly those which increase dimensional stability of photographic materials. Suitable synthetic polymers include those described in U.S. Pat. 3,142,586 of Nottorf issued July 28, 1964; U.S. Pat. 3,193,386 of White issued July 6, 1955; U.S. Pat. 3,062,674 of Houck et al. issued Nov. 6, 1962; U.S. Pat. 3,220,844 of Houck et al. issued Nov. 30, 1965; U.S. Pat. 3,287,289 of Ream et al. issued Nov. 22, 1966; and U.S. Pat. 3,411,911 of Dykstra issued Nov. 19, 1968. Effective polymers include water insoluble polymers of alkyl acrylates and methacrylates, acrylic acid, sulfoalkyl acrylates or methacrylates, and those which have cross-linking sites which facilitate hardening or curing as well as those having recurring sulfobetaine units as described in Canadian Pat. 774,054. Preferred high molecular weight materials and resins include polyvinyl butyral, cellulose acetate butyrate, polymethyl methacrylate, poly(vinyl pyrrolidone), ethyl cellulose polystyrene, polyvinyl chloride, chlorinated rubber, polyisobutylene, butadiene-styrene copolymers, vinyl chloride-vinyl acetate copolymers, copolymers of vinyl acetate, vinyl chloride and maleic acid, polyvinyl alcohol, and high molecular weight ethylene oxide polymers.

The photosensitive and thermosensitive layers and other layers of an element employed in the practice of the invention and described herein can be coated on a wide variety of supports. Typical supports include cellulose nitrate film, cellulose ester film, poly(vinyl acetal) film, polystyrene film, poly(ethylene terephthalate) film, polycarbonate film and related films or resinous materials, as well as glass, paper, metal and the like. Typically a flexible support is employed, especially a paper support which can be partially acetylated or coated with baryta and/or an alpha olefin polymer, particularly a polymer of an alpha olefin containing 2 to 10 carbon atoms such as polyethylene, polypropylene, ethylene-butene copolymers and the like.

The photosensitive and thermosensitive and other hardenable layers of an element used in the practice of this invention can be hardened by various organic or inorganic hardeners, alone or in combination, such as aldehydes, and blocked aldehydes, ketones, carboxylic and carbonic acid derivatives, sulfonate esters, sulfonyl halides and vinyl sulfonyl ethers, active halogen compounds, epoxy compounds, aziridines, active olefins, isocyanates, carbodiimides, mixed-function hardeners and polymeric hardeners such as oxidized polysaccharides like dialdehyde starch and oxyguargum and the like.

The photosensitive and thermosensitive elements used in the practice of the invention can contain antistatic or conducting layers. Such layers can comprise soluble salts such as chlorides, nitrates and the like, evaporated metal layers, ionic polymers such as those described in U.S. Pat. 2,861, 056 of Minsk issued Nov. 18, 1958 and U.S. Pat. 3,206,312 of Sterman et al. issued Sept. 14, 1965 or insoluble inorganic salts such as those described in U.S. Pat. 3,428,451 of Trevoy issued Feb. 18, 1969. The photosensitive and thermosensitive elements can also contain antihalation materials and antihalation dyes.

The photosensitive and thermosensitive layers or other layers employed in the practice of the invention can contain plasticizers and lubricants. Suitable plasticizers and lubricants include, for example, polyalcohols such as glycerin and diols described, for example, in U.S. Pat. 2,960,404 of Milton et al. issued Nov. 1, 1966; fatty acids or esters such as those described in U.S. Pat. 2,588,765 of Robijns issued Mar. 11, 1952; U.S. Pat. 3,121,060 of Duane issued Feb. 11, 1964; and silicone resins such as those described in British 955,061.

The photosensitive and thermosensitive layers or other layers employed in the practice of the invention can contain surfactants such as saponin; anionic compounds such as alkyl aryl sulfonates described, for example, in U.S. Pat. 2,600,831 of Baldsiefen issued June 17, 1962; amphoteric compounds such as those described in U.S. Pat. 3,133,816 of Ben-Ezra issued May 19, 1964; and adducts of glycidol and an alkyl phenol such as those described in British Pat. 1,022,878.

If desired, the photosensitive and thermosensitive elements employed in the practice of the invention can contain matting agents such as starch, titanium dioxide, zinc oxide, silica, polymeric beads including beads described, for example, in U.S. Pat. 2,922,101 of Jelley et al. issued July 11, 1961 and U.S. Pat. 2,701,245 of Lynn issued Feb. 1, 1955.

The photosensitive and thermosensitive elements employed in the practice of the invention can contain brightening agents including stilbenes, triazines, oxazoles, and coumarin brightening agents. Water-soluble brightening agents can be used such as those described in German Pat. 972,067 and U.S. Pat. 2,933,390 of McFall et al. issued Apr. 19, 1960 or dispersions of brighteners can be used such as those described in German Pat. 1,150,274; U.S. Pat. 3,406,070 of Oetiker et al. issued Oct. 15, 1968 and French Pat. 1,530,244.

The various layers including the photosensitive and thermosensitive layers of an element employed in the practice of the invention can contain light-absorbing materials, filter dyes, antihalation dyes and absorbing dyes such as those described in U.S. Pat. 3,253,921 of Sawdey issued May 31, 1966; U.S. Pat. 2,274,782 of Gaspar issued Mar. 3, 1942; U.S. Pat. 2,527,583 of Silberstein et al. issued Oct. 31, 1950; and U.S. Pat. 2,956,879 of VanCampen issued Oct. 18, 1960. If desired, the dyes can be mordanted, for example, as described in U.S. Pat. 3,282,699 of Jones et al. issued Nov. 1, 1966.

The photosensitive and thermosensitive layers used in the practice of the invention can be coated by various coating procedures including dip coating, airknife coating, curtain coating or extrusion coating using hoppers such as described in U.S. Pat. 2,681,294 of Beguin issued June 15, 1954. If desired, two or more layers can be coated simultaneously such as by the procedures described in U.S. Pat. 2,761,791 of Russell issued Sept. 4, 1956 and British 837,095.

If desired, the photosensitive silver halide can be prepared in situ in the photosensitive and thermosensitive coatings of an element employed in the practice of the invention. Such a method is described, for example, in U.S. Pat. 3,457,075 of Morgan et al. issued July 22, 1969. For example, a dilute solution of a halogen acid such as hydrochloric acid can be applied to the surface of a thin coating containing an organic silver salt, such as silver behenate, on a suitable substrate followed by removal of the solvent if desired. Silver halide is thus formed in situ throughout the surface of the coating of the organic silver salt.

The photosensitive silver halide can be prepared on the oxidizing agent such as silver behenate or silver stearate or other organic silver salt prior to application of the silver halide on the support employed. This is also described in U.S. Pat. 3,457,075 of Morgan et al. issued July 22, 1969, for example, a halogen acid such as hydrochloric acid or hydrobromic acid can be mixed with an organic silver salt in a suitable reaction medium. A halide salt more soluble than the organic silver salt can be added to a suspension of the organic silver salt to form the silver halide. A suitable reaction medium includes water or other solutions which do not interfere with the reaction.

Stability to light exposure is increased by employing highly purified materials; for example, freedom from halides and sulfides increase stability to light exposure. The use of highly purified silver behenate can, for example, reduce light sensitivity of an element according to the invention.

Spectral sensitizing dyes can be used conveniently to confer additional sensitivity to the light sensitive silver halide employed in the practice of the invention. For instance, additional spectral sensitization can be obtained by treating the silver halide with a solution of a sensitizing dye in an organic solvent or the dye can be added in the form of a dispersion as described in British Pat. 1,154,781. For optimum results the dye can either be added to the emulsion as a final step or at some earlier stage.

Sensitizing dyes useful in sensitizing silver halide emulsions are described, for example, in U.S. Patent 2,526,632 of Brooker et al. issued Oct. 24, 1950; U.S. Patent 2,503,-776 of Sprague issued Apr. 11, 1950; U.S. Patent 2,493,-748 of Brooker et al. issued Jan. 10, 1950 and U.S. Patent 3,384,486 of Taber et al. issued May 21, 1968. Spectral sensitizers which can be used include the cyanines, merocyanines, complex (trinuclear or tetranuclear) merocyanines, complex (trinuclear or tetranuclear) cyanines, holopolar cyanines, styryls, hemicyanines such as enamine hemicyanines, oxonols and hemioxonols. Dyes of the cyanine classes can contain such basic nuclei as the thiazolines, oxazolines, pyrrolines, pyridines, oxazoles, thiazoles, selenazoles, and imidazoles. Such nuclei can contain alkyl, alkylene, hydroxyalkyl, sulfoalkyl, carboxyalkyl, aminoalkyl, and enamine groups that can be fused to carbocyclic or heterocyclic ring systems either unsubstituted or substituted with halogen, phenyl, alkyl, haloalkyl, cyano, or alkoxy groups. The dyes can be symmetrical or unsymmetrical and can contain alkyl, phenyl, enamine or heterocyclic substituents on the methine or polymethine chain.

The merocyanine dyes can contain the basic nuclei described as well as acid nuclei such as thiohydantoins, rhodanines, oxazolidenediones, thiazolidenediones, barbituric acids, thiazolineones, and malononitrile. These acid nuclei can be substituted with alkyl, alkylene, phenyl, carboxyalkyl, sulfoalkyl, hydroxyalkyl, alkoxyalkyl, alkylamino groups, or heterocyclic nuclei. Combinations of these dyes can be used, if desired. In addition supersensitizing addenda which do not absorb visible light may be included such as, for instance, ascorbic acid derivatives, azaindenes, cadmium salts, and organic sulfonic acid as described in U.S. Pat. 2,933,390 of McFall et al. issued Apr. 19, 1960 and U.S. Pat. 2,937,089 of Jones et al. issued May 17, 1960.

The sensitizing dyes and other addenda used in the practice of the invention can be added from water solutions or suitable organic solvent solutions can be used. The compounds can be added using various procedures including, for example, those described in U.S. Pat. 2,912,343 of Collins et al. issued Nov. 10, 1959; U.S. Pat. 3,342,605 of McCrossen et al. issued Sept. 19, 1967; U.S. Pat. 2,996,-287 of Audran issued Aug. 15, 1961; and U.S. Pat. 3,425,-835 of Johnson et al. issued Feb. 4, 1969.

A range of concentration of dye can be employed in the practice of the invention. The desired concentration will be influenced by the desired spectral sensitivity, other components in the system, the desired image, processing conditions and the like. Typically a concentration of the described sensitizing dye is about 0.05 to about 1 milligram per square foot of the described photosensitive and thermosensitive element, usually about 0.1 milligram per square foot of dye being employed.

It is advantageous to employ a so-called activator toner in the described photosensitive and thermosensitive elements. Various activator toners can be employed for this purpose. Typically a heterocyclic organic activator toning agent containing at least two hetero atoms in the heterocyclic ring of which at least one is a nitrogen atom is employed. These are described, for example, in U.S. Pat. 3,080,254 of Grant issued Mar. 5, 1963. Suitable activator toners include, for example, phthalazinone, phthalic anhydride, 2-acetyl phthalazinone, 2-phthalyl phthalazinone. Other suitable activator toners are described, for example, in U.S. Pat. 3,446,648 of Workman issued May 27, 1969.

Another embodiment of the invention is: in a photosensitive and thermosensitive composition comprising an oxidation-reduction image forming combination comprising (a) an oxidizing agent and (b) a reducing agent, an activator toning agent and a binder, the improvement comprising a nonaqueous, polar, organic solvent for the described image-forming combination, said solvent having at least one $$-\overset{O}{\overset{\|}{C}}-,\ -\overset{O}{\overset{\|}{S}}-$$

or—$SO_2$— group and said composition being solid at about 20° C.

The photosensitive and thermosensitive composition can comprise, for instance, (a) silver behenate,
(b) a phenolic reducing agent,
(c) a photographic silver halide,
(d) a phthalazinone activator toner,
(e) polyvinylbutyral binder,
(f) methylsulfinylmethane, tetrahydrothiophene-1,1-dioxide and/or 4-hydroxybutanoic acid lactone acid,
(g) a sensitizing dye.

After exposure of the described photosensitive and thermosensitive element, the resulting latent image is developed and the developed image stabilized merely by heating the element. Accordingly another embodiment of the invention is: in a process of developing a latent image in an exposed photosensitive and thermosensitive element comprising a support, an oxidation-reduction image forming combination comprising (a) an oxidizing agent and (b) a reducing agent, an activator toning agent, a binder and a non-aqueous, organic polar solvent for said image-forming combination, said solvent having at least one $$-\overset{O}{\overset{\|}{C}}-,\ -\overset{O}{\overset{\|}{S}}-$$

or —$SO_2$— group, and being solid at about 20° C. in said element, comprising heating said element to about 70° C. to about 250° C.

A temperature range of about 70° C. to about 250° C. is suitable for developing and stabilizing a desired image. By increasing or decreasing the length of time of heating, a higher or lower temperature within the described range can be employed. A developed and stable image is typically produced within a few seconds such as about 1 second to about 30 seconds.

Processing is usually carried out under ambient conditions of temperature, pressure and humidity. Temperatures, pressures, and humidity outside normal atmospheric conditions can be employed if desired; however, normal atmospheric conditions are preferred.

In some cases, if desired, an element can be prepared wherein the described silver halide can be in one layer and other components in other layers. For example, an element according to the invention can comprise a support, a layer containing photosensitive silver halide, and a layer comprising a so-called processing composition comprising (a) a silver salt of an organic acid,
(b) a phenolic reducing agent, and
(c) a non-aqueous, polar, organic solvent for said composition, said solvent having at least one $$-\overset{O}{\overset{\|}{C}}-,\ -\overset{O}{\overset{\|}{S}}-$$

or —$SO_2$— group and said composition being solid at about 20° C. A processing composition of this type is a photographic processing composition comprising (a) silver behenate,
(b) a silver halide developing agent, and
(c) methylsulfinylmethane, tetrahydrothiophene - 1,1-dioxide, and/or 4-hydroxybutanoic acid lactone. Typically a polyvinyl butyral binder is employed with this processing composition.

Various means can be employed in providing the necessary heating of the described photosensitive and thermosensitive elements. The heating means can be a simple hot plate, iron or the like.

Other addenda known to be useful in photosensitive and thermosensitive elements of this type such as described in British Pat. 1,161,777 published Aug. 20, 1969 and U.S. Pat. 3,152,904 of Sorensen et al. issued Oct. 13, 1964 can be employed in the practice of the invention.

The following examples are included for a further understanding of the invention.

EXAMPLE 1

This illustrates the invention.

A photosensitive element is prepared as follows:

A coating composition is prepared by mixing the following components:

| | | |
|---|---|---|
| Polyvinyl butyral | g | 1.25 |
| Silver behenate | g | 3.50 |
| Behenic acid | g | 3.90 |
| Sodium bromide | g | 0.20 |
| Acetone | ml | 25.00 |
| Toluene | ml | 25.00 |

After ball-milling for 18 hours, the following compounds are added to 2.0 milliliters of the resulting dispersion:

| | Ml. |
|---|---|
| Acetone containing 0.01% by weight 3-ethyl-5-[(3 - ethyl - 2(3H) - benzothiazolylidene) - isopropylidene]-2-thio-2,4-oxazolidinedione | 0.25 |
| Acetone containing 5% by weight 2,2′-methylene-bis-(6-t-butyl-4-methylphenol) | 2.00 |
| Acetone containing 1% by weight 1-(2H)-phthalazinone | 2.00 |
| Acetone containing 5% by weight tetrahydrothiophene-1,1-dioxide | 0.60 |

The composition is mixed and then coated on a water-resistant paper support at 2 millimiters per square foot of support and dried providing a photosensitive and thermosensitive element.

The photosensitive element is exposed sensitometrically with tungsten light for 0.5 second. The resulting latent image is developed by holding the photosensitive element in contact with a curved metal block at 90° C. for 15 seconds.

A developed image is produced. The maximum density of the image is 0.86 and the minimum density is 0.08 with very low background stain.

EXAMPLE 2

This is a comparative example.

The procedure set out in Example 1 is repeated with the exception that the tetrahydrothiophene-1,1-dioxide is omitted from the described photosensitive and thermosensitive element.

The resulting developed image has a maximum density of 0.40 and a minimum density of 0.04.

EXAMPLE 3

This is a comparative example. The procedure set out in Example 1 is repeated with the exception that 1-(2H)-phthalazinone and the sensitizing dye is omitted from the described photosensitive and thermosensitive element and hydroquinone, a developing agent, is added to the dispersion which already contains the organic reducing agent, 2,2′ - methylene - bis - (6 - t - butyl - 4 - methylphenol). The resulting image is bluish-black with a definite pinkish-orange background. This demonstrates that a more active silver halide developing agent in addition to 2,2′-methylene-bis(6-t-butyl-4-methylphenol) can produce an image in the absence of a activator toning agent such as 1-(2H)-phthalazinone.

EXAMPLE 4

This illustrates the invention employing a non-aqueous, polar, organic solvent containing a $$-\overset{\overset{\displaystyle O}{\|}}{C}-$$

moiety. The procedure set out in Example 1 is repeated with the exception that 11.0 moles per silver mole of 4-hydroxybutanoic acid lactone is employed in place of 8.1 moles per silver mole of tetrahydrothiophene-1,1-dioxide.

This provides an image which has a maximum density of 0.54 and a minimum density of 0.04. The resulting image has brown maximum density areas and white background areas.

EXAMPLE 5

This illustrates the invention employing a non-aqueous, polar, organic solvent containing a $$-\overset{\overset{\displaystyle O}{\|}}{S}-$$

moiety. The procedure set out in Example 1 is repeated with the exception that 12.5 moles per silver mole of methylsulfinylmethane is employed in place of 8.1 moles per silver mole of tetrahydrothiophene-1,1-dioxide.

This provides an image which has a maximum density of 0.86 and a minimum density of 0.04. The resulting image is light brown with gray-white background areas.

EXAMPLE 6

Similar results are obtained as in Example 1 upon substitution of 2,5 - dihydro-3-methylthiophene-1,1-dioxide for tetrahydrothiophene-1,1-dioxide.

EXAMPLE 7

Similar results are obtained as in Example 3 upon substitution of 5-hydroxypentanoic acid lactone for 4-hydroxybutanoic acid lactone.

EXAMPLE 8

Similar results are obtained as in Example 4 upon substitution of phenylsulfinylmethane for methylsulfinylmethane.

The invention has been described in detail with particular reference to preferred embodiments thereof, but it will be understood that variations and modifications can be effected within the spirit and scope of the invention.

I claim:

1. In a photosensitive and thermosensitive element comprising a support having thereon, an oxidation-reduction image forming combination comprising (a) a silver salt oxidizing agent and (b) a reducing agent, (c) a catalyst for said oxidation-reduction image forming combination and a binder, the improvement comprising a non-aqueous organic, polar solvent for said image-forming combination, said solvent having at least one $$-\overset{\overset{\displaystyle O}{\|}}{C}-,\ -\overset{\overset{\displaystyle O}{\|}}{S}-$$

or —$SO_2$— group, and being solid at about 20° C. in said element.

2. A photosensitive and thermosensitive element as in claim 1 wherein said solvent is methylsulfinylmethane.

3. A photosensitive and thermosensitive element as in claim 1 wherein said solvent is tetrahydrothiophene-1,1-dioxide.

4. A photosensitive and thermosensitive element as in claim 1 wherein said solvent is 4-hydroxybutanoic acid lactone.

5. A photosensitive and thermosensitive element as in claim 1 wherein said catalyst is photographic silver halide.

6. A photosensitive and thermosensitive element as in claim 1 also comprising an activator toning agent for said image-forming combination.

7. A photosensitive and thermosensitive element as in claim 1 wherein said oxidizing agent comprises a silver salt of an organic acid.

8. A photosensitive and thermosensitive element as in claim 1 wherein said reducing agent is a phenolic reducing agent.

9. A photosensitive and thermosensitive element as in claim 1 comprising a sensitizing dye.

10. A photosensitive and thermosensitive element comprising a support having thereon at least one layer comprising:

(a) silver behenate,
(b) a phenolic reducing agent,
(c) photographic silver halide,
(d) a phthalazinone activator toner,
(e) polyvinylbutyral binder,
(f) tetrahydrothiophene-1,1-dioxide, and
(g) a sensitizing dye.

11. A photosensitive and thermosensitive element comprising a support having thereon at least one layer comprising:

(a) silver behenate
(b) a phenolic reducing agent,
(c) photographic silver halide,
(d) a phthalazinone activator toner, (e) polyvinylbutyral binder,
(f) 4-hydroxybutanoic acid lactone, and
(g) a sensitizing dye.

12. A photosensitive and thermosensitive element comprising a support having thereon at least one layer comprising:
(a) silver behenate,
(b) a phenolic reducing agent,
(c) photographic silver halide,
(d) a phthalazinone activator toner,
(e) a polyvinylbutyral binder,
(f) methylsulfinylmethane, and
(g) a sensitizing dye.

13. In a photosensitive and thermosensitive composition comprising an oxidation-reduction image forming combination comprising (a) a silver salt oxidizing agent and (b) a reducing agent, (c) an activator toning agent, (d) a catalyst for said oxidation-reduction image forming combination and a binder, the improvement comprising a non-aqueous, organic, polar solvent for said image-forming combination, said solvent having at least one $$-\overset{\displaystyle O}{\overset{\|}{C}}-,\ -\overset{\displaystyle O}{\overset{\|}{S}}-$$

or $-SO_2-$ group, and said composition being solid at about 20° C.

14. A photosensitive and thermosensitive composition as in claim 13 wherein said catalyst is photographic silver halide.

15. A photosensitive and thermosensitive composition comprising
(a) silver behenate,
(b) a phenolic reducing agent,
(c) photographic silver halide,
(d) a phthalazinone activator toner,
(e) polyvinylbutyral binder,
(f) tetrahydrothiophene-1,1-dioxide, and
(g) a sensitizing dye.

16. A photosensitive and thermosensitive composition comprising
(a) silver behenate,
(b) a phenolic reducing agent,
(c) photographic silver halide,
(d) a phthalazinone activator toner,
(e) polyvinylbutyral binder,
(f) 4-hydroxybutanoic acid lactone, and
(g) a sensitizing dye.

17. A photosensitive and thermosensitive composition comprising
(a) silver behenate,
(b) a phenolic reducing agent,
(c) photographic silver halide,
(d) a phthalazinone activator toner,
(e) polyvinylbutyral binder,
(f) methylsulfinylmethane, and
(g) a sensitizing dye.

18. A process of developing a latent image is an exposed photosensitive and thermosensitive element comprising a support having thereon an oxidation-reduction image forming combination comprising (a) a silver salt oxidizing agent and (b) a reducing agent, (c) an activator toning agent, (d) a catalyst for said oxidation-reduction image forming combination, a binder and a non-aqueous, organic, polar solvent for said image-forming combination, said solvent having at least one $$-\overset{\displaystyle O}{\overset{\|}{C}}-,\ -\overset{\displaystyle O}{\overset{\|}{S}}-$$

or $-SO_2-$ group, and being solid at about 20° C. in said element, comprising heating said element to about 70° C. to about 250° C.

19. A process as in claim 18 wherein said catalyst is photographic silver halide.

20. A process as in claim 18 wherein said solvent is tetrahydrothiophene-1,1-dioxide.

21. A process as in claim 18 wherein said solvent is 4-hydroxybutanoic acid lactone.

22. A process as in claim 18 wherein said solvent is methylsulfinylmethane.

23. A process as in claim 18 wherein said element is heated to about 70° C. to about 250° C. for about 1 to about 30 seconds.

24. A photographic processing composition comprising
(a) a silver salt of an organic acid,
(b) a phenolic reducing agent, and
(c) a non-aqueous, organic, polar solvent for said composition, said solvent having at least one $$-\overset{\displaystyle O}{\overset{\|}{C}}-,\ -\overset{\displaystyle O}{\overset{\|}{S}}-$$

or $-SO_2-$ group
said composition being solid at about 20° C.

25. A photographic processing composition as in claim 24 comprising
(a) silver behenate,
(b) a phenolic reducing agent and
(c) tetrahydrothiophene-1,1-dioxide.

26. A photographic processing composition as in claim 24 comprising
(a) silver behenate,
(b) a phenolic reducing agent and
(c) 4-hydroxybutanoic acid lactone.

27. A photographic processing composition as in claim 24 comprising
(a) silver behenate,
(b) a phenolic reducing agent, and
(c) methylsulfinylmethane.

References Cited

UNITED STATES PATENTS

| | | | |
|---|---|---|---|
| 3,180,731 | 4/1965 | Roman | 96—114.1 |
| 3,220,846 | 11/1965 | Tinker | 96—114.1 |
| 3,347,675 | 10/1967 | Henn | 96—63 |
| 3,429,706 | 2/1969 | Shepard | 117—34 |
| 3,438,776 | 4/1969 | Yudelson | 96—111 |
| 3,457,075 | 7/1969 | Morgan | 96—114.1 |

FOREIGN PATENTS

| | | | |
|---|---|---|---|
| 1,038,029 | 8/1966 | Great Britain | 96—114.5 |

NORMAN G. TORCHIN, Primary Examiner

J. R. HIGHTOWER, Assistant Examiner

U.S. Cl. X.R.

177—36.8; 250—65.1

PO-1050
(5/69)

UNITED STATES PATENT OFFICE
CERTIFICATE OF CORRECTION

Patent No. 3,667,959 Dated June 6, 1972

Inventor(s) Stanley M. Bojara and Richard A. DeMauriac

It is certified that error appears in the above-identified patent and that said Letters Patent are hereby corrected as shown below:

In Column 2, line 59, after "Gould" insert ---,---.

In Column 4, line 1, "2,3-dihydro" should read ---2,5-dihydro---.

In Column 5, line 74, "and" should read ---or---.

In Column 6, line 73, after "cellulose" insert ---,---.

In Column 11, line 15, "millimiters" should read ---milliliter---.

In the Claims:

In Column 13, line 58, "is" should be ---in---.

Signed and sealed this 19th day of December 1972.

(SEAL)
Attest:

EDWARD M.FLETCHER,JR.
Attesting Officer

ROBERT GOTTSCHALK
Commissioner of Patents